United States Patent
Ren et al.

(10) Patent No.: US 7,184,281 B2
(45) Date of Patent: Feb. 27, 2007

(54) BUCK CONVERTER WITH HIGH EFFICIENCY GATE DRIVER PROVIDING EXTREMELY SHORT DEAD TIME

(75) Inventors: Yuancheng Ren, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 238 days.

(21) Appl. No.: 10/969,215

(22) Filed: Oct. 21, 2004

(65) Prior Publication Data

US 2006/0087304 A1 Apr. 27, 2006

(51) Int. Cl.
*H02M 3/335* (2006.01)
*G01F 17/00* (2006.01)
*G05F 1/40* (2006.01)

(52) U.S. Cl. .................................. 363/24; 323/355

(58) Field of Classification Search ................ 323/222, 323/268, 270, 271, 355, 359, 362; 363/22, 363/24, 56.06, 25
See application file for complete search history.

(56) References Cited

U.S. PATENT DOCUMENTS

| | | | |
|---|---|---|---|
| 6,249,111 B1 * | 6/2001 | Nguyen | ....................... 323/282 |
| 6,734,656 B2 * | 5/2004 | Miller et al. | ................. 323/284 |
| 6,903,535 B2 * | 6/2005 | Liu et al. | ..................... 323/222 |
| 7,016,203 B2 * | 3/2006 | Xu et al. | .................. 363/21.04 |

\* cited by examiner

*Primary Examiner*—Matthew V. Nguyen
(74) *Attorney, Agent, or Firm*—Whitham, Curtis, Christofferson & Cook, PC

(57) ABSTRACT

A buck converter has a driver circuit with a drive transformer that provides complementary voltages to the buck converter switches. The drive transformer may have two secondary windings, with one winding for each converter switch. As one converter switch experiences a rising gate voltage, the other converter switch experiences a falling gate voltage. Since both converter switches are controlled by the same driver switches, the converter switch dead time is very small. Preferably, at least one converter switch has a voltage shift circuit connected to the gate electrode. Adjustment of the voltage shift magnitude will advance or delay the turn on and turn off times of the switch. Hence, the converter switch dead time can be precisely adjusted by varying the voltage shift magnitude. Preferably, the converter switch dead time is less than 1 or 2 nanoseconds.

28 Claims, 3 Drawing Sheets

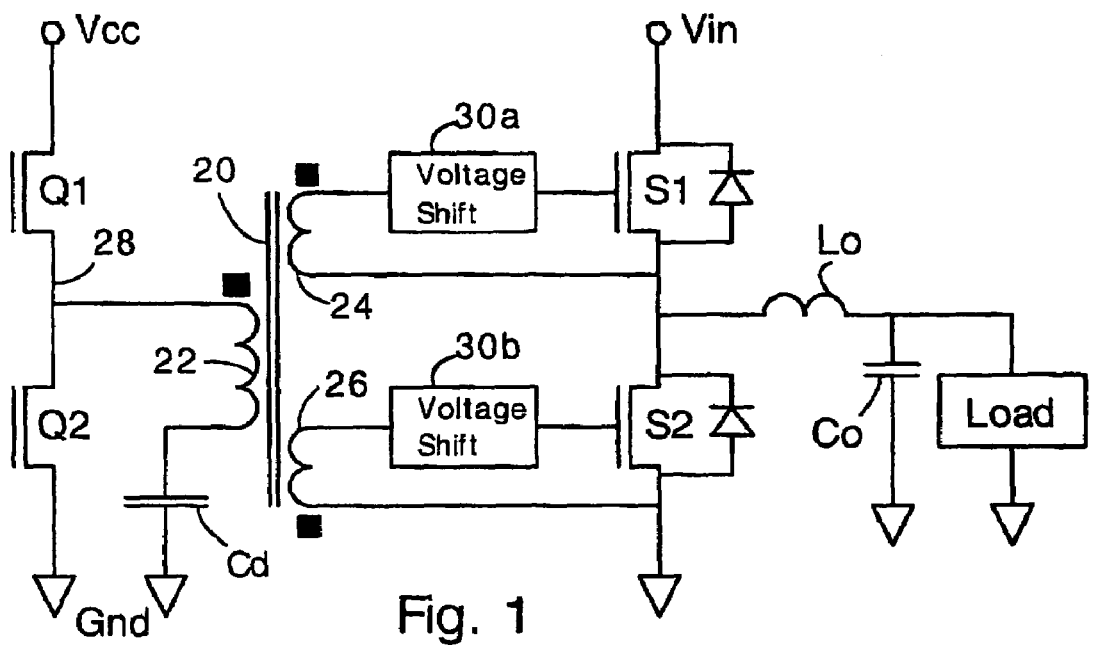
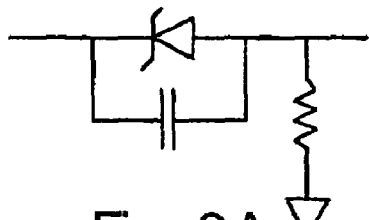
Fig. 2A
Voltage shift circuit
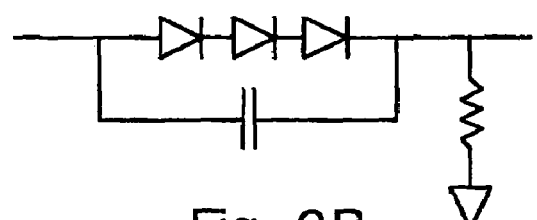
Fig. 2B
Voltage shift circuit
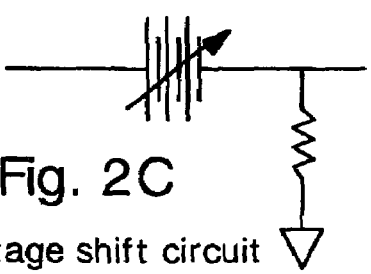
Fig. 2C
Voltage shift circuit
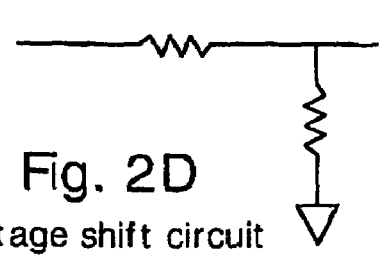
Fig. 2D
Voltage shift circuit
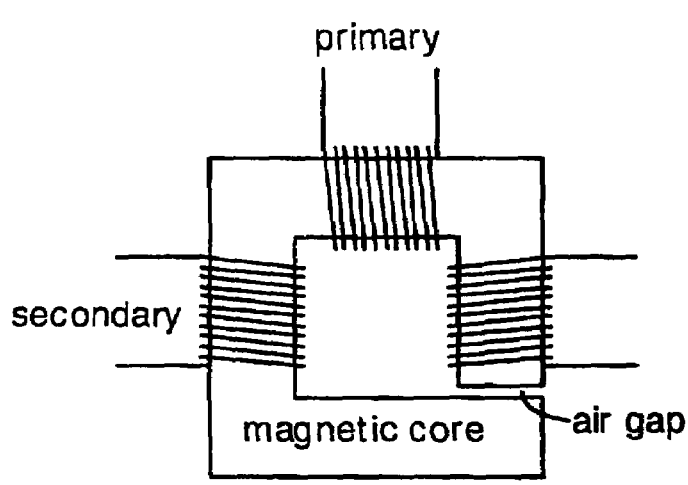
Fig. 7

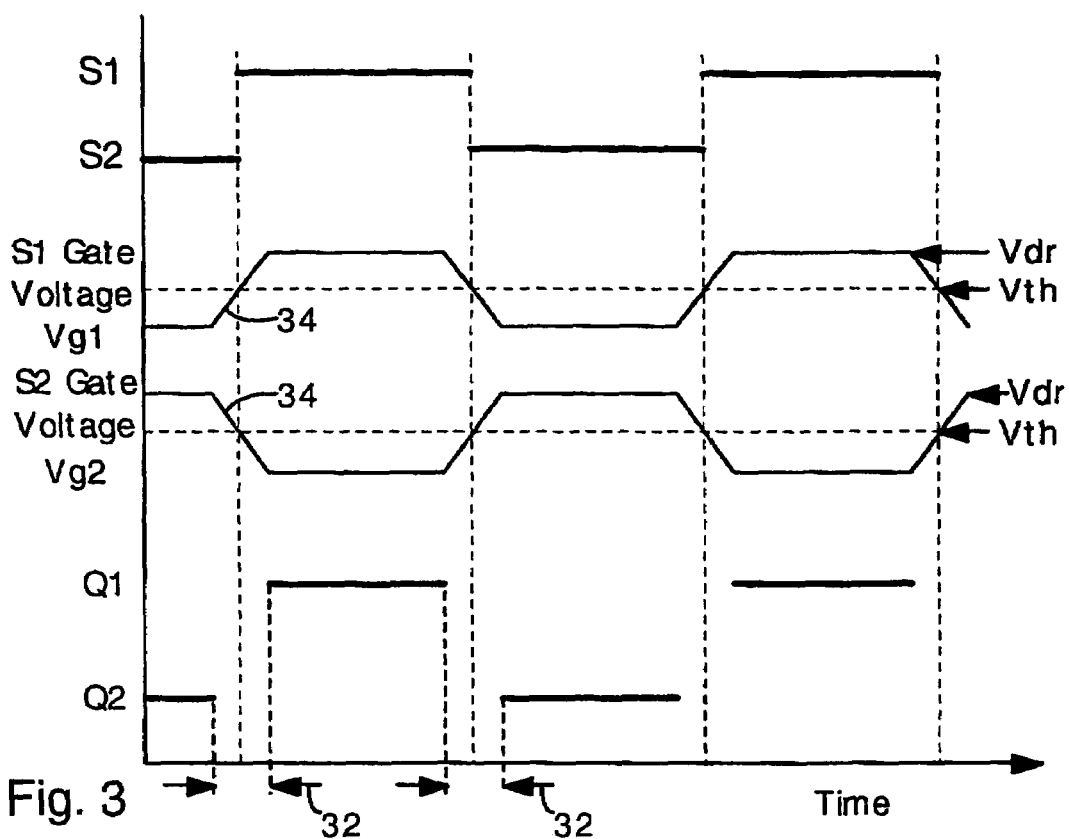
Fig. 3
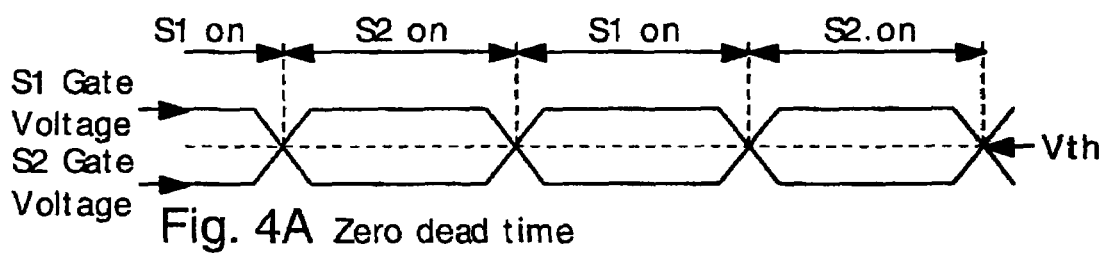
Fig. 4A Zero dead time
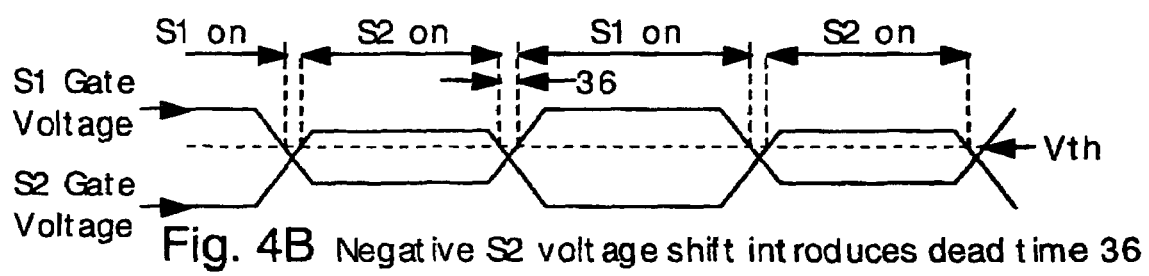
Fig. 4B Negative S2 voltage shift introduces dead time 36
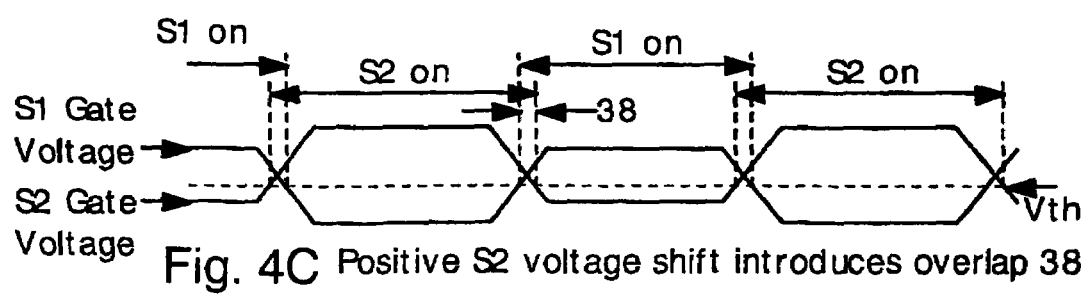
Fig. 4C Positive S2 voltage shift introduces overlap 38

BUCK CONVERTER WITH HIGH EFFICIENCY GATE DRIVER PROVIDING EXTREMELY SHORT DEAD TIME

FIELD OF THE INVENTION

The present invention relates to buck converters and drivers for operating the buck converter switches. Particularly, the present invention relates to a simple gate driver circuit that reduces body diode conduction loss and driver loss. The present gate driver increases the efficiency of a buck converter.

BACKGROUND OF THE INVENTION

Buck converters are commonly used in electronics for changing the voltage or polarity of a power supply. Buck converters typically employ two electronic switches (typically MOSFETs) in combination with an output inductor. The switches are alternately turned on, thereby providing voltage pulses to the output inductor.

During portions (dead times) of the switching cycle, both switches are off. When both switches are off, the output inductor produces freewheeling current that flows through the integral body diode of one of the switches. Body diode current produces substantial energy loss due to the forward-bias voltage drop across the diode, thereby reducing the energy efficiency of the buck converter. In order to improve the efficiency of buck converters, the dead time must be reduced as much as possible.

Another source of loss in buck converters is driver loss. In conventional buck converters, energy required to charge the switch gates is dissipated in the driver circuit. This energy loss substantially affects the converter efficiency.

In order to provide buck converters with small size and weight, and reduced cost, it is best to operate the buck converter at high frequency. However, energy loss from both body diode conduction and driver loss increase with increasing operating frequency. Body diode conduction and driver loss tends to limit the maximum operating frequency of buck converters.

SUMMARY OF THE INVENTION

It would be an advance in the art of buck converter design to provide a buck converter having greatly reduced body diode conduction loss and reduced driver loss. Such a buck converter could operate with very high efficiency compared to conventional buck converters, and could operate at high frequency. High frequency capability can provide many benefits such as smaller size and weight, and reduced cost.

An aspect of the invention provides a buck converter having a pair of converter switches and a pair of driver switches. The driver switches are connected in series between a power source and ground. The converter also has a transformer and a drive capacitor. The driver capacitor and a transformer primary are connected to the driver switches. The transformer has two secondary windings, with one winding connected to each converter switch. This circuit produces complementary gate driver voltages at the two secondary windings.

Preferably, a voltage shift circuit is connected to one or both secondary windings. The voltage shift circuit can comprise a reverse-biased zener diode, several forward biased rectifying diodes, or a voltage divider resistor network.

Also preferably, the transformer has a core with an air gap that reduces the magnetizing inductance. The gap and reduced magnetizing inductance tends to reduce driver losses.

In an alternative embodiment, the transformer has a single secondary connected to one of the converter switches. The other converter switch is connected to the midpoint where the driver switches are connected. This embodiment has a smaller number of components and a smaller size.

DESCRIPTION OF THE DRAWING FIGURES

FIG. 1 shows a buck converter according to the present invention.

FIGS. 2A, 2B, 2C, and 2D show examples of voltage shift circuits.

FIG. 3 shows a timing diagram illustrating circuit operation.

FIG. 4A illustrates gate voltages and circuit timing when the switches S1 S2 have zero dead time.

FIG. 4B illustrates how a negative voltage shift of the S2 gate drive voltage introduces a dead time for converter switches S1 S2.

FIG. 4C illustrates how a positive voltage shift of the S2 gate drive voltage introduces an overlap ON time for converter switches S1 S2.

FIG. 7 illustrates a two-secondary transformer with an air gap.

DETAILED DESCRIPTION OF THE PREFERRED EMBODIMENTS OF THE INVENTION

Figure 5:
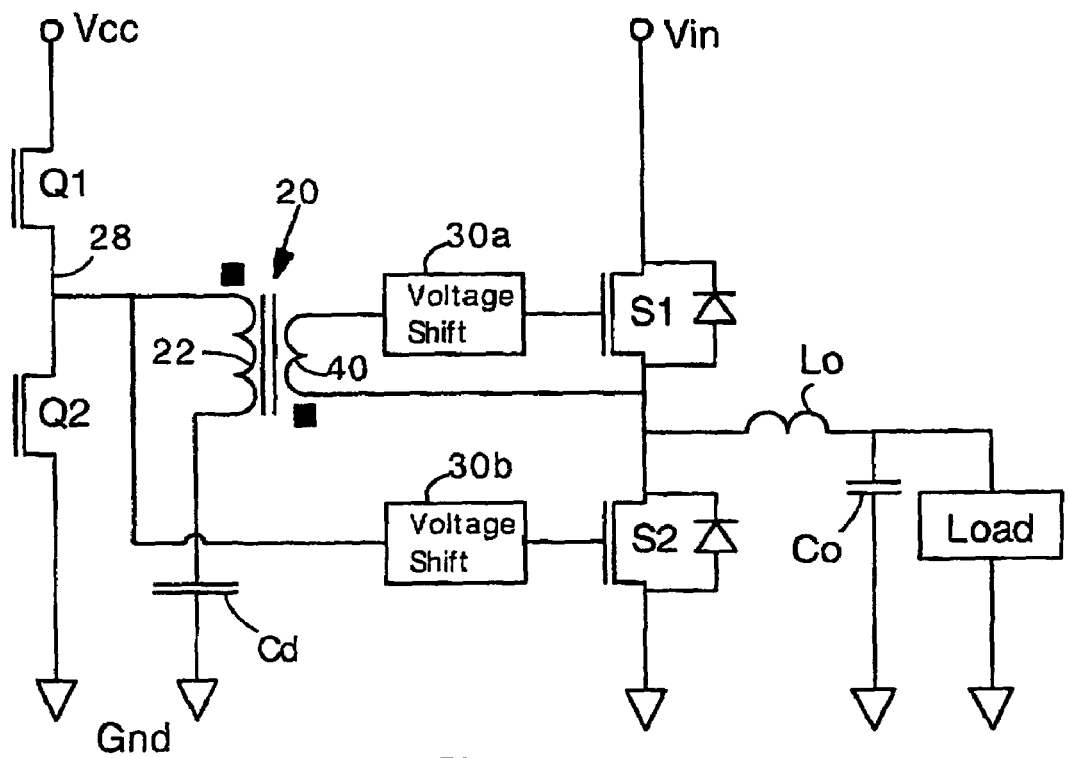
FIG. 5 shows an alternative embodiment of the invention in which the transformer has a single secondary winding.

A buck converter with reduced body diode conduction loss and reduced driver loss is discussed herein. The present buck converter has a novel driver circuit. The novel driver circuit comprises a transformer for driving the converter switches. The driver circuit is configured so that complementary voltages are supplied to the gates of the converter switches (e.g., the voltage of one switch gate rises while the other falls). Preferably, a voltage shift circuit is provided in series with one of the gates. Adjusting the shift voltage provides precise control over the relative timing of the switch transitions. The voltage shift circuit is adjusted so that the converters transition through the threshold voltage at the same instant. In this way, the dead time can be extremely small (e.g., less than 1 or 2 nanoseconds). Additionally, the unique configuration of the driver circuit allows recapturing of the gate drive energy, and thereby reduction in gate drive loss. The buck converter of the present invention can provide a 5–6% boost in conversion energy efficiency over comparable buck converters (at a frequency of 2 Mhz).

FIG. 1 shows a buck converter according to the present invention. The buck converter has converter switches S1 S2 connected in series between a Vin voltage and a ground Gnd, an output inductor Lo, and an output capacitor Co, as well known in the art. The buck converter of the present invention includes two drive switches Q1 Q2 connected in series. The drive switches are connected to a drive transformer 20. The drive transformer has a primary winding 22, coupled to two secondary windings 24 26. Black squares indicate the relative polarity of these transformer windings. The drive circuit also includes a drive capacitor Cd. The primary winding 22 is connected to a midpoint 28 between the two drive switches Q1 Q2. The drive capacitor Cd is connected between the primary winding 22 and ground Gnd.

The drive switches Q1 Q2 will typically be MOSFET devices, and can be internal to an integrated circuit designed for driving a buck converter. The converter switches S1 S2 will typically be MOSFET devices, as known in the art.

The drive capacitor Cd functions as a voltage source, and should have as large a capacitance as practical. For circuits operating at about 1 Mhz, for example, the drive capacitor can have a capacitance of about 1 microfarad.

Voltage shift circuits 30a 30b are connected to the gates of the converter switches S1 S2. The voltage shift circuits 30a 30b provide a voltage shift to the gates of switches S1 S2. The voltage shift circuits 30a 30b are optional but preferred. In an alternative embodiment that minimizes cost and circuit size, only one voltage shift circuit is provided. FIGS. 2A–2B illustrate exemplary voltage shift circuits.

In FIG. 2A, a reverse-biased Zener diode (connected in parallel with a capacitor) provides a voltage shift (equal to the reverse breakdown voltage), and in FIG. 2B a series of forward biased diodes provide a voltage shift. The circuits of FIGS. 2A and 2B can only provide negative voltage shift.

FIG. 2C shows a voltage shift circuit comprising a small voltage source such as a power supply or battery. The voltage shift magnitude can be fixed or variable. The magnitude of the voltage shift influences the timing of the turn-on and turn-off times of the switches S1 S2.

FIG. 2D shows a voltage shift circuit comprising a voltage-divider resistor network. A voltage divider will tend to have a slower turn off and turn on speed, which is typically not desirable.

FIG. 3 shows a timing diagram illustrating the operation of the circuit of FIG. 1. Dark horizontal lines indicate when switches S1 S2 Q1 Q2 are ON. Converter switches S1 S2 each have gate threshold voltages Vth, as well known in the art. Switches Q1 Q2 operate with a substantial driver switch dead time 32. During the driver switch dead times 32, the S1 and S2 gate voltages (Vg1 Vg2) ramp 34 in opposite directions. The S1 S2 gate voltages are complementary; the gate voltage of one switch rises as the gate voltage of the other switch falls. Switches S1 S2 turn ON and turn OFF when the gate voltages Vg1 Vg2 pass through the threshold voltages Vth. The gate voltages Vg1 Vg2 reach a maximum drive voltage Vdr. The drive voltages Vdr must be greater than the threshold voltage Vth.

It is important to note that the present driver circuits produce complementary voltages at the S1 and S2 gates. The complementary gate voltages always add up to approximately the supply voltage Vcc, with an offset created by the voltage shift circuits, if present. In mathematical terms, Vg1+Vg2=nVcc+Vs, where n is the primary/secondary turns ratio of the transformer 20, and Vs is the voltage shift magnitude. For n=1, Vcc should be selected to be greater than the threshold voltage of the converter switches S1 S2.

The voltage shift provided by the voltage shift circuits 30a 30b will affect the timing of the converter switches S1 S2. In fact, slight adjustments in the magnitude of the voltage shifts can be used to precisely adjust the timing of the converter switches' S1 S2 operation. This is because the gate voltages ramp during the dead times 32. A slight boost or slight reduction in the gate voltage will cause the converter switches S1 S2 to turn on and off slightly earlier or slightly later.

In a preferred embodiment of the invention, the converter switches are operated with a very small dead time (i.e. less than 0.5, or 1 or 2 nanoseconds). FIG. 4A illustrates S1 and S2 gate voltages for an embodiment in which the converter switch dead time is very close to zero. The S1 and S2 gate voltages pass through the threshold voltage Vth at nearly the same instant. The extremely small dead time of FIG. 4A may be provided by adjustment of the voltage shift circuits 30a 30b.

FIG. 4B illustrates an embodiment in which a negative voltage shift is applied to the gate of switch S2. Consequently, switch S2 turns ON later, and turns OFF earlier, compared to the situation of FIG. 4A. A converter switch dead time 36 is therefore introduced. In the present invention, the converter switch dead time 36 is preferably less than about 1, 2, or 4 nanoseconds. Preferably, the dead time is positive but as close to zero as possible. An extremely short time is preferred because it reduces body diode conduction loss.

FIG. 4C illustrates an embodiment in which a positive voltage shift is applied to the gate of switch S2. Consequently, switch, S2 turns ON earlier, and turns OFF later, compared to the situation of FIG. 4A. A converter switch overlap ON time 38 is therefore introduced. An excessively long overlap ON time can cause catastrophic short-circuit surge damage to the buck converter. However, the buck converter will typically not experience short-circuit surge damage if the ON-state overlap duration is less than about 4 or 5 nanoseconds. It is noted that positive voltage shift is generally best avoided. A positive voltage shift can cause undesired triggering from noise.

Preferably, there is no ON time overlap. However, if there is an overlap ON time 38, it should be less than 1 or 2 nanoseconds.

If the voltage shift circuit comprises a variable voltage source (e.g. such as an electronic power supply), or variable voltage drop, then the timing of one or both switches can be easily adjusted while the circuit is in operation. In fact, the voltage shift can be adjusted dynamically so that the converter switch dead time is always a certain desired value, even with variations in driver circuit operation.

It is noted that the turns ratio n of the transformer 20 will influence the gate drive voltage. Preferably, the primary/secondary turns ratio is approximately equal to Vcc/Vdr, where Vdr is the gate drive voltage illustrated in FIG. 3. Typically, the transformer will have a turns ratio of 1:1, but other ratios such as 2:1, or 1:2 can also be used.

The present invention includes a specific embodiment that tends to greatly reduce driver loss in the converter switches S1 S2. In conventional buck converters, the energy required to charge the S1 S2 switch gates is largely dissipated as heat, reducing conversion efficiency. In the present invention, energy stored in the gate capacitor of the converter switches S1 S2 is recycled back to the voltage source Vcc. For example, in the present invention, when Q2 is turned off, energy from the switch S2 gate capacitor travels through the transformer 20 and charges the Q2 gate capacitor. This energy recycling process reduces gate driver loss and increases energy efficiency. It is important to note that this energy recycling is most efficient if the transformer 20 has an air gap in its core. The presence of an air gap increases the current ripple in the transformer, which improves energy transfer between switches S1 S2 and voltage source Vcc. Hence, it is preferred in the invention for the transformer 20 to have an air gap core. The presence of an air gap in the transformer 20 tends to slightly increase the energy efficiency. FIG. 7 illustrates a two-secondary transformer with an air gap.

FIG. 5 illustrates an embodiment of the invention where the transformer 20 has only two windings. The transformer 20 has the primary winding 22 and a single secondary winding 40. The gate of switch S2 is connected to the midpoint 28. Two voltage shift circuits 30a 30b are shown, but are optional. A single voltage shift circuit can be used with either switch S1 or switch S2. The circuit of FIG. 5 is operated in the same manner as the circuit of FIG. 1. Drive switches Q1 Q2 are alternately switches with a dead time 32 between ON states. Switches S1 S2 receive complementary gate drive voltages, and the timing of the switches S1 S2 can be adjusted by adjusting the voltage shift circuits.

Figure 6:
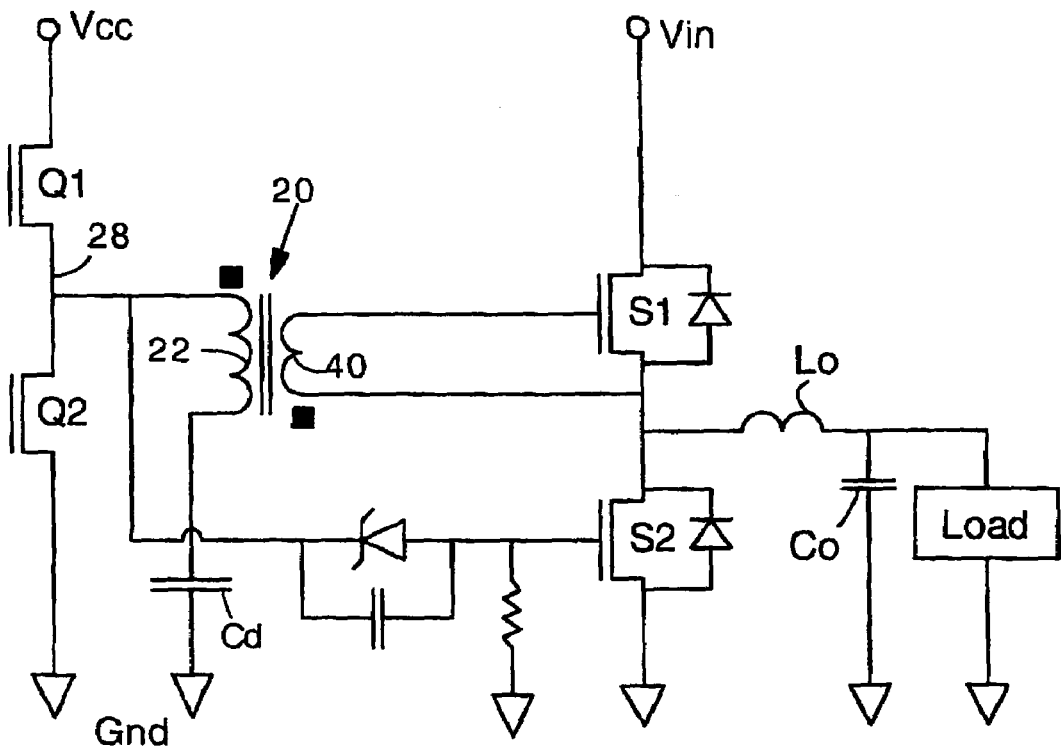
FIG. 6 shows the circuit of FIG. 5 combined with the voltage shift circuit of FIG. 2A.

FIG. 6 shows the single-secondary circuit of FIG. 5 combined with the zener diode voltage shift circuit of FIG. 2A.

It is also noted that the converter switches can be identical or different switches. For example, the threshold voltages for the converter switches S1 S2 can be the same or different. Additionally, the driver voltage Vdr can be the same or different for the converter switches S1 S2.

Also, the air gap does not necessarily comprise air. The 'air gap' can comprise a thin layer of any other nonferromagnetic material.

It will be clear to one skilled in the art that the above embodiment may be altered in many ways without departing from the scope of the invention. Accordingly, the scope of the invention should be determined by the following claims and their legal equivalents.

What is claimed is:

1. A buck converter, comprising:
   a pair of converter switches, connected in series between a power source and ground;
   a pair of driver switches, connected in series between a power source and ground, the driver switches being connected at a midpoint;
   a drive capacitor; and
   a drive transformer comprising a primary winding and two secondary windings, each of said secondary windings being coupled to said primary winding, wherein:
   i) the primary winding is connected between the midpoint and the drive capacitor;
   ii) the drive capacitor is connected between the primary winding and ground; and
   iii) the secondary windings are connected to gate terminals of the converter switches; and
   iv) the two secondary windings have respective polarities, and each is connected to a respective one of said pair of converter switch's gate terminal such that a current through said primary winding produces concurrent complementary voltages on said gate terminals.

2. The buck converter of claim 1 further comprising at least one voltage shift circuit connected to the gate terminal of one of said converter switches.

3. The buck converter of claim 2 wherein said at least one voltage shift circuit comprises a reverse-biased zener diode.

4. The buck converter of claim 2 wherein said at least one voltage shift circuit comprises at least one forward biased diode.

5. The buck converter of claim 1 wherein the drive transformer has a core with an air gap.

6. The buck converter of claim 1 further comprising one voltage shift circuit connected to the gate terminal of each converter switch.

7. The buck converter of claim 2 wherein the voltage shift circuit is constructed and arranged to provide a voltage shift such that a converter switch dead time is less than 2 nanoseconds.

8. A buck converter, comprising:
   top and bottom converter switches, connected in series between a power source and a ground;
   a pair of driver switches, connected in series between a power source and a ground, the driver switches being connected at a midpoint;
   an electrical connection between said midpoint and a pate of the bottom converter switch;
   a drive capacitor;
   a drive transformer comprising a primary winding and a single secondary winding; and
   an electrical connection between said single secondary winding and a gate of the top converter switch, wherein:
   i) the primary winding is connected between the midpoint and the drive capacitor; and
   ii) the drive capacitor is connected between the primary winding and ground.

9. The buck converter of claim 8 wherein said electrical connection between said midpoint and a gate of the bottom converter switch includes a voltage shift circuit.

10. The buck converter of claim 8 wherein at least one of said electrical connection between said midpoint and a gate of the bottom converter switch and said electrical connection between said single secondary winding and a gate of the top converter switch includes least one voltage shift circuit.

11. The buck converter of claim 10 wherein said at least one voltage shift circuit comprises a reverse-biased zener diode.

12. The buck converter of claim 10 wherein said at least one voltage shift circuit comprises one or more forward biased diodes.

13. The buck converter of claim 10 wherein said at least one voltage shift circuit is constructed and arranged to provide a voltage shift such that a converter switch dead time is less than 2 nanoseconds.

14. The buck converter of claim 8 wherein the drive transformer has a core with an air gap.

15. The buck converter of claim 8 further comprising one voltage shift circuit connected to the gate terminal of each of said converter switches.

16. A buck converter, comprising:
   a top converter switch and a bottom converter switch, connected in series;
   a pair of driver switches, connected in series between a power source and ground, the driver switches being connected at a midpoint;
   a drive capacitor;
   a drive transformer comprising a primary winding and a single secondary winding; and
   a voltage shift circuit connected to a gate of the bottom switch or connected to a gate of the top switch, wherein
   i) the primary winding is connected between the midpoint and the drive capacitor;
   ii) the single secondary winding is connected to a gate of the top converter switch;
   iii) the drive capacitor is connected between the primary winding and ground; and
   iv) a gate of the bottom switch is connected to the midpoint.

17. The buck converter of claim 16 wherein the drive transformer has a core with an air gap.

18. A buck converter, comprising:
   a pair of converter switches, connected in series;
   a pair of driver switches, connected in series between a power source and ground, the driver switches being connected at a midpoint;

a drive capacitor;

at least one voltage shift circuit connected to the gate terminal of one of said converter switches; and a drive transformer comprising a primary winding and two secondary windings, wherein
  i) the primary winding is connected between the midpoint and the drive capacitor,
  ii) the drive capacitor is connected between the primary winding and ground, and
  iii) the secondary windings are connected to gate terminals of the converter switches.

19. The buck converter of claim 18 wherein the voltage shift circuit comprises a reverse-biased zener diode.

20. The buck converter of claim 18 wherein the voltage shift circuit comprises at least one forward biased diode.

21. The buck converter of claim 18 wherein the voltage shift circuit is constructed and arranged to provide a voltage shift such that a converter switch dead time is less than 2 nanoseconds.

22. A buck converter, comprising:

a pair of converter switches, connected in series;

a pair of driver switches, connected in series between a power source and ground, the driver switches being connected at a midpoint;

a drive capacitor;

one voltage shift circuit connected to the gate terminal of each converter switch; and a drive transformer comprising a primary winding and two secondary windings, wherein
  i) the primary winding is connected between the midpoint and the drive capacitor,
  ii) the drive capacitor is connected between the primary winding and ground, and
  iii) the secondary windings are connected to gate terminals of the converter switches.

23. A buck converter, comprising:

a top converter switch and a bottom converter switch, connected in series;

a pair of driver switches, connected in series between a power source and a ground, the driver switches being connected at a midpoint;

a drive capacitor;

a voltage shift circuit connected between the gate of the bottom switch and the midpoint; and a drive transformer comprising a primary winding and a single secondary winding, wherein
  i) the primary winding is connected between the midpoint and the drive capacitor,
  ii) the single secondary winding is connected to a gate of the top converter switch,
  iii) the drive capacitor is connected between the primary winding and ground, and
  iv) a gate of the bottom switch is connected to the midpoint.

24. A buck converter, comprising:

a top converter switch and a bottom converter switch, connected in series;

a pair of driver switches, connected in series between a power source and a ground, the driver switches being connected at a midpoint;

a drive capacitor;

at least one voltage shift circuit connected to the gate terminal of one of said converter switches; and a drive transformer comprising a primary winding and a single secondary winding, wherein
  i) the primary winding is connected between the midpoint and the drive capacitor,
  ii) the single secondary winding is connected to a gate of the top converter switch,
  iii) the drive capacitor is connected between the primary winding and ground, and
  iv) a gate of the bottom switch is connected to the midpoint.

25. The buck converter of claim 24 wherein said at least one voltage shift circuit comprises a reverse-biased zener diode.

26. The buck converter of claim 24 wherein said at least one voltage shift circuit comprises at least one forward biased diode.

27. The buck converter of clam 24 wherein said at least one voltage shift circuit is constructed and arranged to provide a voltage shift such that a converter switch dead time is less than 2 nanoseconds.

28. A buck converter, comprising:

a top converter switch and a bottom converter switch, connected in series;

a pair of driver switches, connected in series between a power source and a ground, the driver switches being connected at a midpoint;

a drive capacitor;

one voltage shift circuit connected to the gate terminal of each of said converter switches; and a drive transformer comprising a primary winding and a single secondary winding, wherein
  i) the primary winding is connected between the midpoint and the drive capacitor,
  ii) the single secondary winding is connected to a gate of the top converter switch,
  iii) the drive capacitor is connected between the primary winding and ground, and
  iv) a gate of the bottom switch is connected to the midpoint.

* * * * *